United States Patent
Huang

(10) Patent No.: US 9,659,618 B1
(45) Date of Patent: May 23, 2017

(54) MEMORY INTERFACE, MEMORY CONTROL CIRCUIT UNIT, MEMORY STORAGE DEVICE AND CLOCK GENERATION METHOD

(71) Applicant: PHISON ELECTRONICS CORP., Miaoli (TW)

(72) Inventor: Ming-Chien Huang, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/220,403

(22) Filed: Jul. 27, 2016

(30) Foreign Application Priority Data

Jun. 8, 2016 (TW) .............................. 105118184 A

(51) Int. Cl.
| | | |
|---|---|---|
| G11C 7/00 | (2006.01) | |
| G11C 7/22 | (2006.01) | |
| G11C 7/10 | (2006.01) | |
| G11C 8/18 | (2006.01) | |
| H03K 19/00 | (2006.01) | |
| G06F 3/06 | (2006.01) | |

(52) U.S. Cl.
CPC ............ *G11C 7/222* (2013.01); *G06F 3/0611* (2013.01); *G06F 3/0659* (2013.01); *G06F 3/0673* (2013.01); *G11C 7/10* (2013.01); *G11C 8/18* (2013.01); *H03K 19/0005* (2013.01)

(58) Field of Classification Search
CPC .. G11C 7/10; G11C 7/222; G11C 8/18; G06F 3/0611; G06F 3/0659; G06F 3/0673
See application file for complete search history.

(56) References Cited

U.S. PATENT DOCUMENTS

| | | | |
|---|---|---|---|
| 7,441,070 B2* | 10/2008 | Kao .................... | G06F 13/1673 711/103 |
| 9,128,662 B2* | 9/2015 | Kim ..................... | G06F 1/1658 |
| 9,165,617 B2* | 10/2015 | Shaeffer .............. | G06F 13/1689 |
| 2012/0151127 A1* | 6/2012 | Lim .................... | G06F 12/0246 711/103 |

* cited by examiner

*Primary Examiner* — Pho M Luu
(74) *Attorney, Agent, or Firm* — Jianq Chyun IP Office

(57) ABSTRACT

A memory interface, a memory control circuit unit, a memory storage device and a clock generation method are provided. The method includes: receiving a first data strobe signal and a second data strobe signal from a volatile memory, where the first data strobe signal and the second data strobe signal are differential signals corresponding to each other; if a relative relation between a first voltage value of the first data strobe signal and a reference voltage value of a reference voltage signal conforms to a default condition, generating a clock signal in response to the first data strobe signal and the second data strobe signal; and sampling a data signal from the volatile memory based on a raising edge and a falling edge of the clock signal. Thereby, an accuracy for sampling the data signal from the volatile memory can be improved.

30 Claims, 5 Drawing Sheets

US 9,659,618 B1

MEMORY INTERFACE, MEMORY CONTROL CIRCUIT UNIT, MEMORY STORAGE DEVICE AND CLOCK GENERATION METHOD

CROSS-REFERENCE TO RELATED APPLICATION

This application claims the priority benefit of Taiwan application serial no. 105118184, filed on Jun. 8, 2016. The entirety of the above-mentioned patent application is hereby incorporated by reference herein and made a part of this specification.

BACKGROUND

Technology Field

The present disclosure is related to a clock generation technique and more particularly, to a memory interface, a memory control circuit unit, a memory storage device and a clock generation method.

Description of Related Art

The markets of digital cameras, cellular phones, and MP3 players have expanded rapidly in recent years, resulting in escalated demand for storage media by consumers. A rewritable non-volatile memory module (e.g., a flash memory) is suitable for being built in the aforementioned portable multi-media devices listed above for example due to having characteristics, such as data non-volatility, low power consumption, compact size and no mechanical structure.

As a data transmission clock frequency of a volatile memory is gradually increased, a memory interface is required to sample data signals from the volatile memory more and more accurately. Generally speaking, the memory interface identifies a data strobe signal (DQS) preamble of a DQS from the volatile memory. After the DQS preamble is identified, the memory interface may use the DQS to obtain a clock of a data signal from the volatile memory. However, as the data transmission clock frequency of the volatile memory increasing, the DQS preamble is hard to be identified.

Nothing herein should be construed as an admission of knowledge in the prior art of any portion of the present disclosure. Furthermore, citation or identification of any document in this application is not an admission that such document is available as prior art to the present disclosure, or that any reference foul's a part of the common general knowledge in the art.

SUMMARY

The disclosure provides a memory interface, a memory control circuit unit, a memory storage device and a clock generation method, capable of improving an accuracy for sampling a data signal from the volatile memory.

According to an exemplary embodiment of the present disclosure, a memory interface for connecting a memory controller to a volatile memory is provided. The memory interface includes a sampling circuit and a clock generation circuit. The sampling circuit is configured to couple to the memory controller. The clock generation circuit is coupled to the sampling circuit, the memory controller and the volatile memory. The clock generation circuit is configured to receive a first data strobe signal and a second data strobe signal from the volatile memory. The first data strobe signal and the second data strobe signal are differential signals corresponding to each other. The clock generation circuit is further configured to generate a clock signal in response to the first data strobe signal and the second data strobe signal if a relative relation between a first voltage value of the first data strobe signal and a reference voltage value of a reference voltage signal conforms to a default condition. The sampling circuit is configured to sample a data signal from the volatile memory based on a raising edge and a falling edge of the clock signal.

According to another exemplary embodiment of the present disclosure, a memory control circuit unit for controlling a volatile memory is provided. The memory control circuit unit includes a processor core, a memory controller and a memory interface. The memory controller is coupled to the processor core. The memory interface is coupled to the memory controller and the volatile memory. The memory interface is configured to receive a first data strobe signal and a second data strobe signal from the volatile memory. The first data strobe signal and the second data strobe signal are differential signals corresponding to each other. The memory interface is further configured to generate a clock signal in response to the first data strobe signal and the second data strobe signal if a relative relation between a first voltage value of the first data strobe signal and a reference voltage value of a reference voltage signal conforms to a default condition. The memory interface is further configured to sample a data signal from the volatile memory based on a raising edge and a falling edge of the clock signal.

According to another exemplary embodiment of the present disclosure, a memory storage device including a connection interface unit, a rewritable non-volatile memory module, a volatile memory and a memory control circuit unit is provided. The connection interface unit is configured to couple to a host system. The memory control circuit unit is coupled to the connection interface unit, the rewritable non-volatile memory module and the volatile memory. The volatile memory is configured to send a first data strobe signal and a second data strobe signal. The memory control circuit unit is configured to receive the first data strobe signal and the second data strobe signal. The first data strobe signal and the second data strobe signal are differential signals corresponding to each other. The memory control circuit unit is further configured to generate a clock signal in response to the first data strobe signal and the second data strobe signal if a relative relation between a first voltage value of the first data strobe signal and a reference voltage value of a reference voltage signal conforms to a default condition. The memory interface is further configured to sample a data signal from the volatile memory based on a raising edge and a falling edge of the clock signal.

According to another exemplary embodiment of the present disclosure, a clock generation method for a memory interface for connecting a memory controller to a volatile memory is provided. The clock generation method includes: receiving a first data strobe signal and a second data strobe signal from the volatile memory, wherein the first data strobe signal and the second data strobe signal are differential signals corresponding to each other; generating a clock signal in response to the first data strobe signal and the second data strobe signal if a relative relation between a first voltage value of the first data strobe signal and a reference voltage value of a reference voltage signal conforms to a default condition; and sampling a data signal from the volatile memory based on a raising edge and a falling edge of the clock signal.

To sum up, in the present disclosure, a time point for generating the clock signal by utilizing paired data strobe signals can be determined depending on whether the relative relation between the voltage value of data strobe signal from the volatile memory and the reference voltage value of the reference voltage signal conforms to the default condition. Then, the generated clock signal can be used to sample the data signal from the volatile memory. In this way, an accuracy for sampling the data signal from the volatile memory can be improved.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

To make the above features and advantages of the disclosure more comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
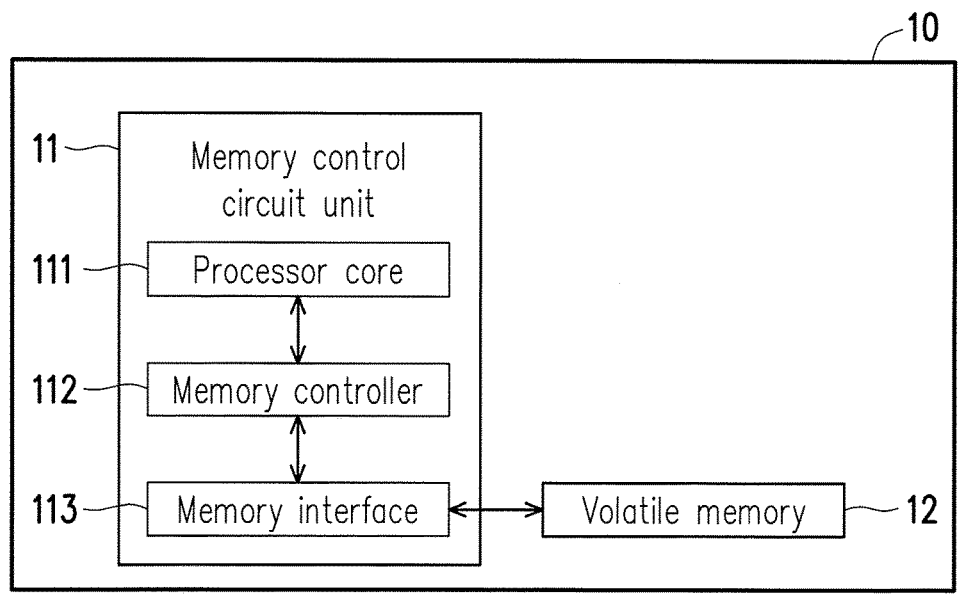
FIG. 1 is a schematic diagram of a memory storage device according to an exemplary embodiment of the present disclosure.

A plurality of exemplary embodiments are provided below to describe the disclosure, though the disclosure is not limited to the provided exemplary embodiments, and the exemplary embodiments can also be suitably combined. A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, a term "signal" refers to at least a current, a voltage, an electric charge, a temperature, data or any other one or a plurality of signals.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1 is a schematic diagram of a memory storage device according to an exemplary embodiment of the present disclosure.

Referring to FIG. 1, a memory storage device 10 includes a memory control circuit unit 11 and a volatile memory 12. The memory control circuit unit 11 may be packaged as a chip or composed of electronic circuits laid out on at least one circuit board. In the present exemplary embodiment, the volatile memory 12 may be a volatile memory of any type, such as a double data rate synchronous dynamic random access memory (DDR SDRAM), a DDR 2 SDRAM, a DDR 3 SDRAM or a DDR 4 SDRAM. In addition, a total number of the volatile memory 12 may be one or a plurality.

In the present exemplary embodiment, the memory control circuit unit 11 and the volatile memory 12 are installed on the same circuit board in the memory storage device 10. The memory control circuit unit 11 supports a data accessing operation toward the volatile memory 12. In an exemplary embodiment, the memory control circuit unit 11 is regarded as a control chip of the volatile memory 12, and the volatile memory 12 is regarded as a cache memory or a buffer memory of the memory control circuit unit 11.

The memory control circuit unit 11 includes a processor core 111, a memory controller 112 and a memory interface 113. The memory controller 112 is coupled to the processor core 111 and the memory interface 113. The processor core 111 is configured to control overall operation of the memory control circuit unit 11 or the memory storage device 10. For example, the processor core 111 may include a processing chip, such as a single-core or a multi-core central processing unit (CPU), or a microprocessor.

The memory controller 112 is served as a communication bridge between the processor core 111 and the volatile memory 12 and is dedicated to control the volatile memory 12. In an exemplary embodiment, the memory controller 112 is also referred to as a dynamic random access memory (DRAM) controller.

The memory interface 113 is configured to couple the memory controller 112 to the volatile memory 12. When the processor core 111 is about to read data from or store data in the volatile memory 12, the memory controller 112 sends a corresponding instruction sequence to the volatile memory 12 through the memory interface 113. When receiving the instruction sequence, the volatile memory 12 stores write data corresponding to the instruction sequence or returns read data corresponding to the instruction sequence to the memory controller 112 through the memory interface 113. In addition, in the memory interface 113, the write data or the read data is transmitted in a form of a data signal. For example, a data signal may be used to transmit bit data including a bit of "1" and a bit of "0".

Figure 2:
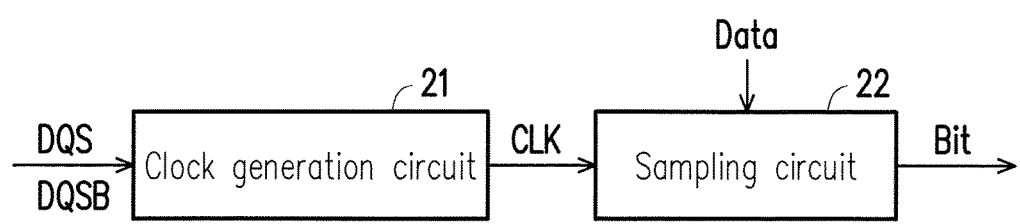
FIG. 2 is a schematic diagram of a memory interface according to an exemplary embodiment of the present disclosure.

FIG. 2 is a schematic diagram of a memory interface according to an exemplary embodiment of the present disclosure.

Referring to FIG. 2, the memory interface 113 includes a clock generation circuit 21 and a sampling circuit 22. The clock generation circuit 21 is coupled to the sampling circuit 22. When the processor core 111 (or the memory controller 112) is about to read data from the volatile memory 12, the volatile memory 12 sends data strobe signals DQS and DQSB to the memory controller 112, where the data strobe signals DQS and DQSB are differential signals corresponding to each other. For example, the data strobe signals DQS and DQSB have the same amplitude but opposite phases (e.g., a difference between the phases of the data strobe signals DQS and DQSB may be 180 degrees). The clock generation circuit 21 receives the data strobe signals DQS and DQSB from the volatile memory 12. For example, the data strobe signals DQS and DQSB are respectively transmitted through data strobe signal pins (DQS pins) in the memory interface 113.

The clock generation circuit 21 determines whether a relative relation between a voltage value (also referred to as a first voltage value) of a first data strobe signal among the data strobe signals DQS and DQSB and a voltage value (also referred to as a reference voltage value) of a reference voltage signal conforms to a default condition. If the relative relation between the first voltage value of the first data strobe signal and the reference voltage value of the reference voltage signal is determined as conforming to the default condition, the clock generation circuit 21 generates a clock signal CLK in response to the first data strobe signal and a second data strobe signal. Thereafter, the sampling circuit 22 receives the clock signal CLK and a data signal Data from the volatile memory 12 and samples the data signal Data based on the clock signal CLK. For example, the data signal Data may be transmitted through data pins (DQ pins) in the memory interface 113. Taking the volatile memory 12 being any type of DDR SDRAM for example, both a raising edge and a falling edge of the clock signal CLK are used to sample the data signal Data. Through sampling the data signal Data, the sampling circuit 22 outputs bit data Bit to the memory controller 112.

In an exemplary embodiment, the operation of determining whether the relative relation between the first voltage value of the first data strobe signal and the reference voltage value of a reference voltage signal conforms to the default condition is for detecting whether the first data strobe signal is in a preamble state. Herein, the preamble state is also referred to as a data strobe signal preamble (DQS preamble) state. If the relative relation between the first voltage value of the first data strobe signal and the reference voltage value of the reference voltage signal conforms to the default condition, the clock generation circuit 21 determines that the first data strobe signal is already in the preamble state. Otherwise, if the relative relation between the first voltage value of the first data strobe signal and the reference voltage value of the reference voltage signal does not conform to the default condition, the clock generation circuit 21 determines that the first data strobe signal is not yet in the preamble state, and the clock generation circuit 21 does not generate the clock signal CLK until the first data strobe signal enters the preamble state.

For descriptive convenience, in the exemplary embodiments that will be described below, the data strobe signal DQS serves as the first data strobe signal, and the data strobe signal DQSB serves as the second data strobe signal. However, in another exemplary embodiment, the first data strobe signal may also refer to the data strobe signal DQSB, and the second data strobe signal may also refer to the data strobe signal DQS.

Figure 3:
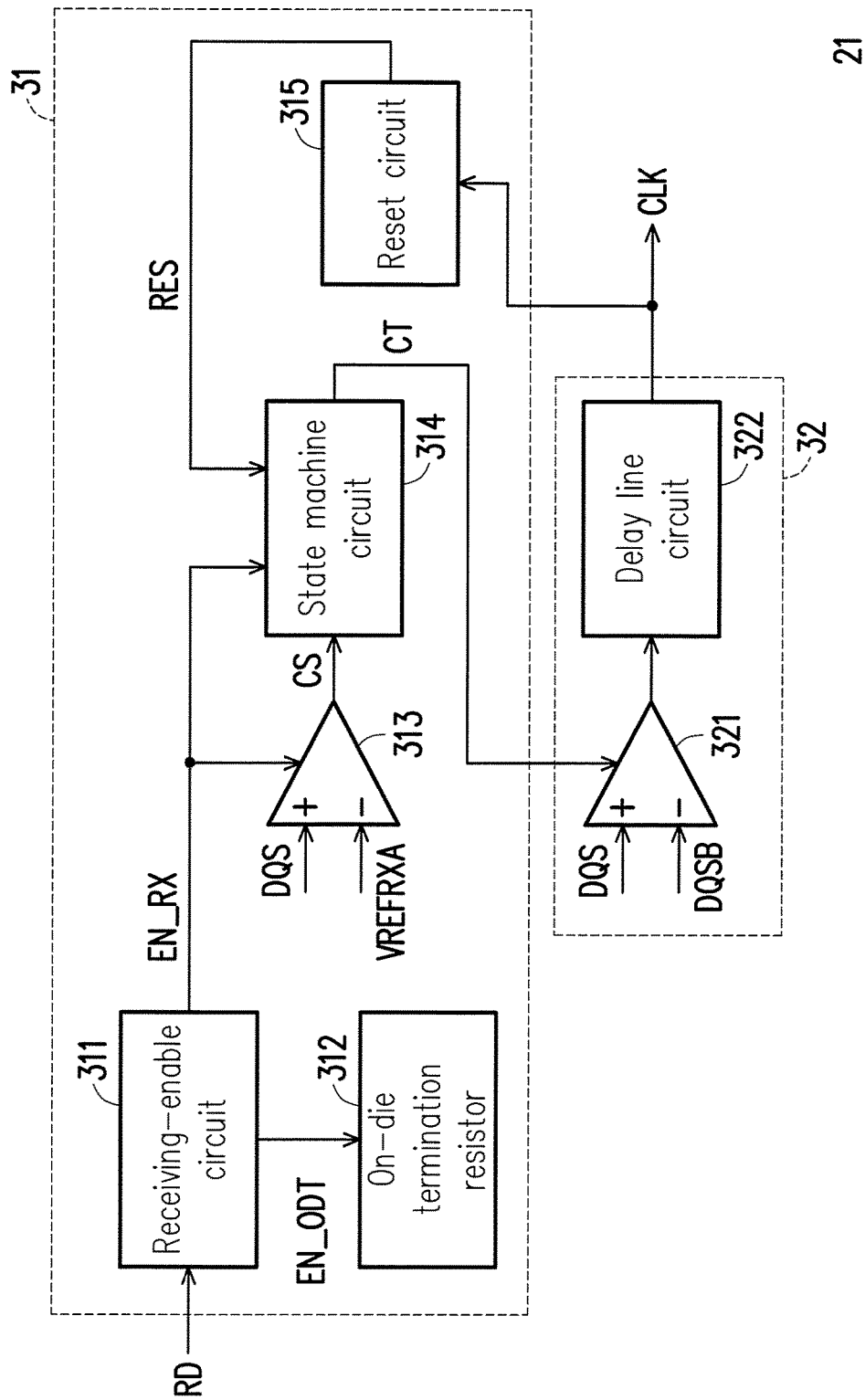
FIG. 3 is a schematic diagram of a clock generation circuit according to an exemplary embodiment of the present disclosure.

FIG. 3 is a schematic diagram of a clock generation circuit according to an exemplary embodiment of the present disclosure.

Referring to FIG. 3, the clock generation circuit 21 includes a control circuit 31 and a clock output circuit 32. The control circuit 31 is coupled to the clock output circuit 32. The control circuit 31 is configured to receive the data strobe signal DQS and a reference voltage signal VREFRXA. The reference voltage signal VREFRXA may be generated by a reference voltage generator (not shown) in the internal of the clock generation circuit 21, or received from the external of the clock generation circuit 21. The control circuit 31 determines whether a relative relation between a voltage value of the data strobe signal DQS and a voltage value of the reference voltage signal VREFRXA conforms to a default condition. If the relative relation between the voltage value of the data strobe signal DQS and the voltage value of the reference voltage signal VREFRXA conforms to the default condition, the control circuit 31 generates a control signal CT. The clock output circuit 32 is configured to receive the data strobe signals DQS and DQSB and the control signal CT and outputs the clock signal CLK in response to the data strobe signals DQS and DQSB and the control signal CT.

Specifically, the control circuit 31 includes a comparator 313 and a state machine circuit 314. The comparator 313 is coupled to the state machine circuit 314. The comparator 313 is configured to compare the voltage value of the data strobe signal DQS and the voltage value of the reference voltage signal VREFRXA and output a comparison signal CS according to the comparison result. The state machine circuit 314 is configured to receive the comparison signal CS from the comparator 313 and output the control signal CT according to the comparison signal CS. For example, if the comparison signal CS corresponds to the comparison result that the relative relation between the voltage value of the data strobe signal DQS and the voltage value of the reference voltage signal conforms to the default condition (e.g., the comparison signal CS is logic high), the state machine circuit 314 outputs the control signal CT. Otherwise, if the comparison signal CS corresponds to the comparison result that the relative relation between the voltage value of the data strobe signal DQS and the voltage value of the reference voltage signal does not conform to the default condition (e.g., the comparison signal CS is logic low), the state machine circuit 314 does not output the control signal CT.

In an exemplary embodiment, the control circuit 31 further includes a receiving-enable circuit 311 coupled to the comparator 313. When the processor core 111 (or the memory controller 112) is about to read data from the volatile memory 12, the receiving-enable circuit 311 receives a read control signal RD from the memory controller 112. The read control signal RD is configured to instruct the memory interface 113 to get ready for receiving data from the volatile memory 12. In response to the read control signal RD, the receiving-enable circuit 311 outputs a receiving-enable signal EN_RX. The comparator 313 receives the receiving-enable signal EN_RX and starts to compare the voltage value of the data strobe signal DQS and the voltage value of the reference voltage signal VREFRXA in response to the receiving-enable signal EN_RX. Otherwise, if the receiving-enable signal EN_RX is not received, the comparator 313 (or the control circuit 31) does not perform the operation of comparing the voltage value of the data strobe signal DQS and the voltage value of the reference voltage signal VREFRXA and being in an idle/standby state which is more power saving.

In an exemplary embodiment, in response to the read control signal RD, the receiving-enable circuit 311 further adjusts the voltage value of the data strobe signal DQS to a predetermined voltage value, where a relative relation between the predetermined voltage value and the voltage value of the reference voltage signal VREFRXA does not conform to the default condition. Referring to FIG. 3, the receiving-enable circuit 311 may send an impedance-enable signal EN_ODT to an on-die termination resistor 312. The on-die termination resistor 312 is located in the memory interface 113 and coupled to signal paths of the data strobe signals DQS and DQSB. In response to the impedance-enable signal EN_ODT, the on-die termination resistor 312 is activated and adjusts the voltage value of the data strobe signal DQS to the predetermined voltage value by adjusting the impedance on the signal path of the data strobe signals DQS and DQSB.

The clock output circuit 32 includes a differential amplifier 321 and a delay line circuit 322. The differential amplifier 321 is coupled to the state machine circuit 314 and the delay line circuit 322. The differential amplifier 321 is configured to receive the control signal CT, the data strobe signals DQS and DQSB and perform a differential amplifying operation on the data strobe signals DQS and DQSB in response to the control signal CT. However, if the control signal CT is not received, the differential amplifier 321 does not perform the differential amplifying operation on the data strobe signals DQS and DQSB and being in the idle/standby state which is more power saving.

The delay line circuit 322 is configured to delay an output signal of the differential amplifier 321 and output the clock signal CLK. For example, the delay line circuit 322 may include at least one delay unit (not shown), and each delay unit may be a positive delay unit or an inverse delay unit. Referring to both FIG. 2 and FIG. 3, since a clock of the data strobe signal DQS (or the data strobe signal DQSB) and a clock of the data signal Data from the volatile memory 12 are the same or similar (e.g., a pulse edge of the data strobe signal DQS is aligned with a pulse edge of the data signal Data), through the delay of the delay line circuit 322, the clock signal CLK has a difference of ¼ clock cycle from the data signal Data (e.g., a phase difference between the clock signal CLK and the data signal Data is about 90 degrees). Thereby, the data signal Data may be sampled based on the clock signal CLK.

In an exemplary embodiment, the control circuit 31 further includes a reset circuit 315 coupled to the state machine circuit 314 and the clock output circuit 322. The reset circuit 315 is configured to count a count value corresponding to the clock signal CLK and determine whether the count value conforms to a count condition. Taking the volatile memory 12 being a DDR 2 SDRAM for example, both the raising edge and the falling edge of the clock signal CLK are used to sample the data signal Data. Thus, after the delay line circuit 322 outputs the clock signal CLK, the reset circuit 315 calculates how many pulse edges of the clock signal CLK have been passed. If one data reading operation toward the volatile memory 12 is performed to read bit data of n bits, the reset circuit 315 sets the count value to m when m pulse edges (including the rising edge and the falling edge) of the clock signal CLK have been passed. When m is equal to n, the reset circuit 315 determines that the count value conforms to the count condition. For example, n may be 4, 8 or 16. In other words, if the count value conforms to the count condition (e.g., m=n), it represents that the clock signal CLK for one data reading operation is completely output. Thus, if the count value conforms to the count condition, the reset circuit 315 generates a reset signal RES. When receiving the reset signal RES, the state machine circuit 314 stops outputting the control signal CT in response to the reset signal RES, such that the differential amplifier 321 (or the clock output circuit 32) returns to the idle/standby state. In the idle/standby state, the clock output circuit 32 does not output the clock signal CLK.

Figure 4:
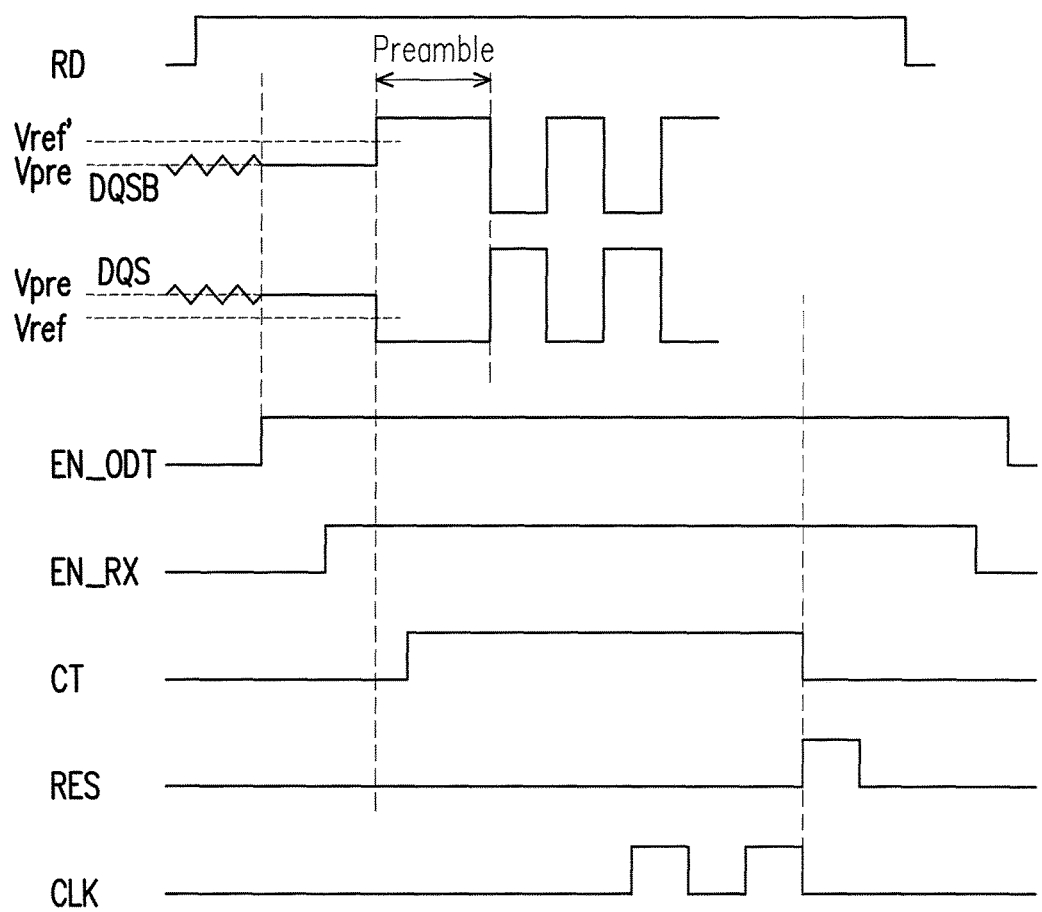
FIG. 4 is a signal timing diagram according to an exemplary embodiment of the present disclosure.

FIG. 4 is a signal timing diagram according to an exemplary embodiment of the present disclosure.

Referring to FIG. 4, at the beginning, both the data strobe signals DQS and DQSB are in an unknown state. When the read control signal RD is pulled high, the impedance-enable signal EN_ODT is also pulled high, such that the voltage values of the data strobe signals DQS and DQSB are synchronously adjusted to a predetermined voltage value Vpre. Meanwhile, in response to the pulling high of the read control signal RD, the receiving-enable signal EN_RX is also pulled high, so as to start detecting whether the data strobe signal DQS enters the preamble state.

Referring to FIG. 4, it is assumed that the voltage value of the reference voltage signal VREFRXA is a reference voltage value Vref, where the predetermined voltage value Vpre is higher than the reference voltage value Vref. Before the data strobe signal DQS enters the preamble state, due to the voltage value (i.e., the predetermined voltage value Vpre) of the data strobe signal DQS being higher than the voltage value (i.e., the reference voltage value Vref) of the reference voltage signal VREFRXA, the control signal CT is continuously pulled low (i.e., the control signal CT is not output). After the data strobe signal DQS enters the preamble state, due to the voltage value of the data strobe signal DQS being pulled low to a voltage value lower than the reference voltage value Vref, the control signal CT is then generated (e.g., pulled high) during a period when the data strobe signal DQS is in the preamble state. In response to the pulling high of the control signal CT, the clock signal CLK is also generated. Thereafter, if the clock signal CLK for one data reading operation is completely output, the reset signal RES is pulled high, such that the control signal CT is then pulled low.

In the present exemplary embodiment, both the predetermined voltage value Vpre and the reference voltage value Vref are set based on a voltage value of a supply voltage VDDQ of the memory controller 112. For example, the predetermined voltage value Vpre may be, approximately, set to a half of the voltage value of the supply voltage VDDQ of the memory controller 112 (i.e., Vpre=0.5×VDDQ), while the reference voltage value Vref may be, approximately, set to 0.3 times of the voltage value of the supply voltage VDDQ (i.e., Vref=0.3×VDDQ). However, in another exemplary embodiment, both the predetermined voltage value Vpre and the reference voltage value Vref may be increased or reduced.

It is noted that, in another exemplary embodiment of FIG. 4, if the first data strobe signal refers to the data strobe signal DQSB, and the second data strobe signal refers to the data strobe signal DQS, the voltage value of the reference voltage signal VREFRXA is set to a reference voltage value Vref. For example, the reference voltage value Vref may be, approximately, set to 0.7 times of the voltage value of the supply voltage VDDQ (i.e., Vref=0.7×VDDQ). Before the data strobe signal DQSB enters the preamble state, due to the voltage value of the data strobe signal DQSB (i.e., the predetermined voltage value Vpre) being lower than the voltage value (i.e., the reference voltage value Vref) of the reference voltage signal VREFRXA, the control signal CT is continuously pulled low. After the data strobe signal DQSB enters the preamble state, due to the voltage value of the data strobe signal DQSB being pulled to a voltage value higher than the reference voltage value Vref, (e.g., the voltage value of the data strobe signal DQSB is pulled up to be approximate to the voltage value of the supply voltage VDDQ), the control signal CT is generated (e.g., pulled high) during a period that the data strobe signal DQSB is in the preamble state.

In other words, if the first data strobe signal refers to the data strobe signal DQS, the relative relation between the first voltage value of the first data strobe signal and the reference voltage value of the reference voltage signal conforming to the default condition refers to that the first voltage value of the first data strobe signal is lower than the reference voltage value of the reference voltage signal, and the relative relation between the first voltage value of the first data strobe signal and the reference voltage value of the reference voltage signal not conforming to the default condition refers to that the first voltage value of the first data strobe signal is not lower than (or is higher than) the reference voltage value of the reference voltage signal. In addition, if the first data strobe signal refers to the data strobe signal DQSB, the relative relation between the first voltage value of the first data strobe signal and the reference voltage value of the reference voltage signal conforming to the default condition refers to that the first voltage value of the first data strobe signal is higher than the reference voltage value of the reference voltage signal, and the relative relation between the first voltage value of the first data strobe signal and the reference voltage value of the reference voltage signal not conforming to the default condition refers to that the first voltage value of the first data strobe signal is not higher than (or is lower than) the reference voltage value of the reference voltage signal.

Figure 5:
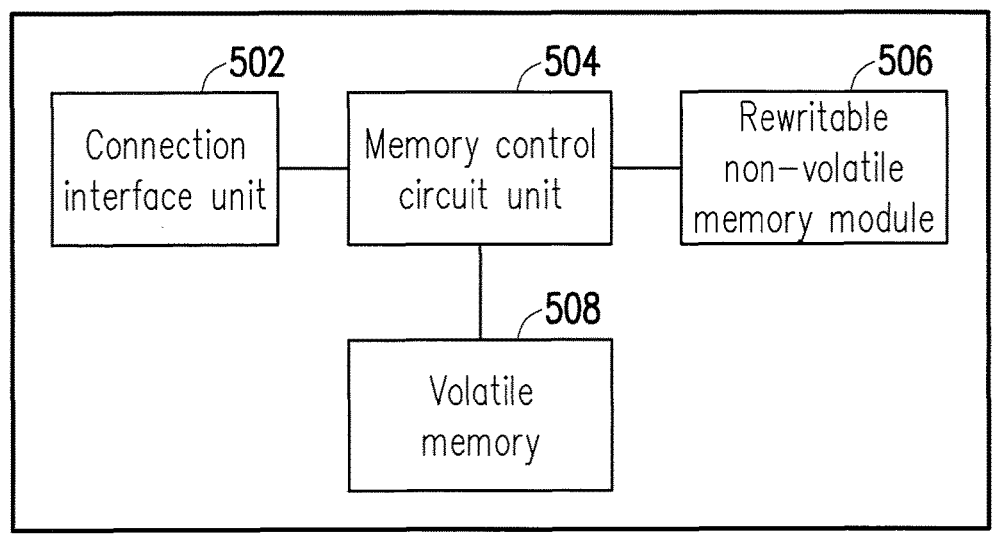
FIG. 5 is a schematic diagram of a memory storage device according to another exemplary embodiment of the present disclosure.

FIG. 5 is a schematic diagram of a memory storage device according to another exemplary embodiment of the present disclosure.

Referring to FIG. 5, a memory storage device 50 is, for example, a solid state drive (SSD) including both a rewritable non-volatile memory module 506 and a volatile memory 508. The memory storage device 50 is used together with a host system, and the host system writes data into or read data from the memory storage device 50. For example, the host system as mentioned can substantially be any system collocated with the memory storage device 50, such as a desktop computer, a notebook computer, a digital camera, a video camera, a communication device, an audio player, a video player or a tablet computer.

The memory storage device 50 includes a connection interface unit 502, a memory control circuit unit 504, the rewritable non-volatile memory module 506 and the volatile memory 508. The connection interface unit 502 is configured to couple the memory storage device 50 to the host system. In the present exemplary embodiment, the connection interface unit 502 complies with a serial advanced technology attachment (SATA) standard. However, it should be understood that the present disclosure is not limited thereto. The connection interface unit 502 may also comply with a parallel advanced technology attachment (PATA) standard, a peripheral component interconnect express (PCI Express) standard, a universal serial bus (USB) or other suitable standards. The connection interface unit 502 may be package with the memory control circuit unit 504 in one chip or laid outside a chip including the memory control circuit unit 504.

The memory control circuit unit 504 is configured to perform operations such as data writing, data reading or data erasing in the rewritable non-volatile memory module 506 according to the instructions of the host system. The rewritable non-volatile memory module 506 is coupled to the memory control circuit unit 504 and configured to store data written by the host system. The rewritable non-volatile memory module 506 may also be a single-level cell (SLC) NAND flash memory module (i.e., a flash memory module capable of storing data of 1 bit in one memory cell), a multi-level cell (MLC) NAND flash memory module (i.e., a flash memory module capable of storing data of 2 bits in one memory cell), a triple-level cell (TLC) NAND flash memory module (i.e., a flash memory module capable of storing data of 3 bits in one memory cell), any other flash memory module, or any other memory module with the same characteristics.

In the present exemplary embodiment, the memory control circuit unit 504 also has the same and/or similar electronic circuit structure of the memory control circuit unit 11 of the exemplary embodiments illustrated in FIG. 1 through FIG. 4 above, and the volatile memory 508 is the same as or similar to the volatile memory 12 described in the exemplary embodiment illustrated in FIG. 1 above. Thus, descriptions related to the memory control circuit unit 504 and the volatile memory 508 may refer to the exemplary embodiments illustrated in FIG. 1 through FIG. 4 and will not be repeatedly described.

It is noted that, the electronic circuit structure illustrated in FIG. 3 merely schematically illustrates the clock generation circuit 21 and the sampling circuit 32 of some of the exemplary embodiments and construes no limitations to the present disclosure. In some embodiments that are not mentioned, more electronic components may be added in any one of the clock generation circuit 21 and the sampling circuit 32 to provide additional functions. Additionally, in some embodiments that are not mentioned, the circuit layout and/or the component coupling relation of any one of the clock generation circuit 31 and the sampling circuit 32 may also be adaptively changed to meet physical demands.

Figure 6:
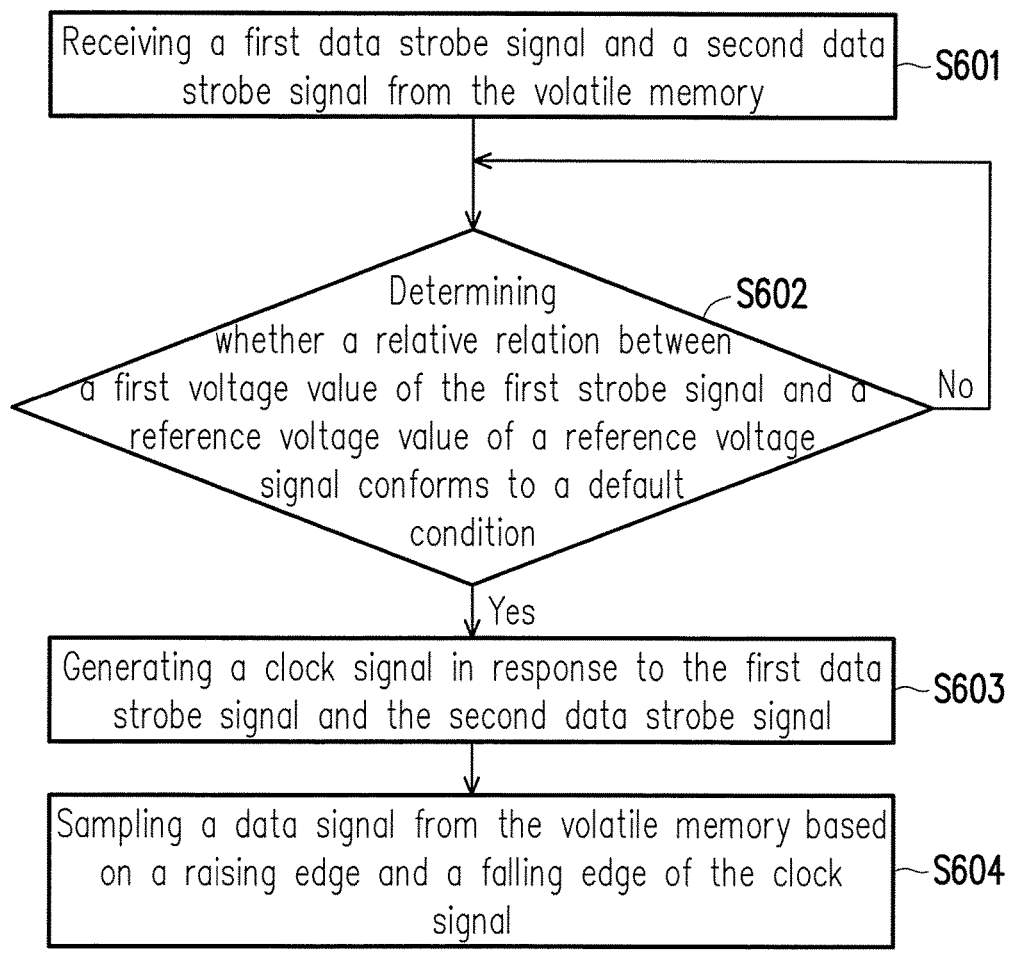
FIG. 6 is a flowchart of a clock generation method according to an exemplary embodiment of the present disclosure.

FIG. 6 is a flowchart of a clock generation method according to an exemplary embodiment of the present disclosure. The clock generation method is applicable to the memory storage device described in the exemplary embodiment illustrated in FIG. 1 or FIG. 5. In the following, the method will be described with reference to FIG. 1 and FIG. 2 in collocation with FIG. 6.

Please refer to FIGS. 1, 2 and 6, in step S601, the clock generation circuit 21 receives a first data strobe signal (e.g., the data strobe signal DQS) and a second data strobe signal (e.g., the data strobe signal DQSB) from the volatile memory 12. In step S602, whether a relative relation between a first voltage value of the first data strobe signal and a reference voltage value of a reference voltage signal conforms to a default condition is determined. For example, in an exemplary embodiment that the first data strobe signal refers to the data strobe signal DQS, in step S602, whether the voltage value of the data strobe signal DQS is lower than the reference voltage value is determined. If yes, the relative relation between the first voltage value of the first data strobe signal and the reference voltage value of the reference voltage signal is determined as conforming to the default condition, and if no, the relative relation between the first voltage value of the first data strobe signal and the reference voltage value of the reference voltage signal is determined as not conforming to the default condition. Alternatively, in another exemplary embodiment that the first data strobe signal refers to the data strobe signal DQSB, in step S602, whether the voltage value of the data strobe signal DQSB is higher than the reference voltage value is determined. If yes, the relative relation between the first voltage value of the first data strobe signal and the reference voltage value of the reference voltage signal is determined as conforming to the default condition, and if no, the relative relation between the first voltage value of the first data strobe signal and the reference voltage value of the reference voltage signal is determined as not conforming to the default condition.

If the determination result in step S602 is "yes", in step S603, the clock generation circuit 21 generates a clock signal CLK in response to the first data strobe signal and the second data strobe signal. In step S604, the sampling circuit 22 samples a data signal Data from the volatile memory 12 based on a raising edge and a falling edge of the clock signal CLK. Additionally, if the determination result in step S602 is "no", step S602 is performed repeatedly, until the relative relation between the first voltage value of the first data strobe signal and the reference voltage value of the reference voltage signal conforms to the default condition.

Nevertheless, each step of FIG. 6 has been described as above and will not repeated hereinafter. It is should be noted that each step illustrated in FIG. 6 may be implemented as a plurality of program codes or circuits, but construes no limitations to the present disclosure. Additionally, the method illustrated in FIG. 6 may be implemented together with the exemplary embodiments above or may be performed solely, and the present disclosure is not limited thereto.

Based on the above, in the present disclosure, whether one of the data strobe signal enters the preamble state can be determined depending on whether the relative relation between the voltage value of the data strobe signal from the volatile memory and the reference voltage value of the reference voltage signal conforms to the default condition. If the data strobe signal enters the preamble state, the clock signal can be generated by the paired data strobe signals. Then, the generated clock signal can be used to sample the data signal from the volatile memory. Thereby, the accuracy for sampling the data signal from the volatile memory can be improved.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory interface for connecting a memory controller to a volatile memory, comprising:
   a sampling circuit configured to couple to the memory controller; and
   a clock generation circuit coupled to the sampling circuit, the memory controller and the volatile memory,
   wherein the clock generation circuit is configured to receive a first data strobe signal and a second data strobe signal from the volatile memory, wherein the first data strobe signal and the second data strobe signal are differential signals corresponding to each other,
   wherein the clock generation circuit is further configured to generate a clock signal in response to the first data strobe signal and the second data strobe signal if a relative relation between a first voltage value of the first data strobe signal and a reference voltage value of a reference voltage signal conforms to a default condition,
   wherein the sampling circuit is configured to sample a data signal from the volatile memory based on a raising edge and a falling edge of the clock signal.

2. The memory interface according to claim 1, wherein the clock generation circuit comprises:
   a control circuit configured to receive the first data strobe signal and the reference voltage signal and generate a control signal if the relative relation between the first voltage value of the first data strobe signal and the reference voltage value of the reference voltage signal conforms to the default condition; and
   a clock output circuit coupled to the control circuit and configured to receive the first data strobe signal, the second data strobe signal and the control signal,
   wherein the clock output circuit is further configured to output the clock signal in response to the first data strobe signal, the second data strobe signal and the control signal.

3. The memory interface according to claim 2, wherein the control circuit comprises:
   a comparator configured to compare the first voltage value of the first data strobe signal with the reference voltage value of the reference voltage signal and output a comparison signal; and
   a state machine circuit coupled to the comparator and configured to output the control signal according to the comparison signal.

4. The memory interface according to claim 3, wherein the control circuit further comprises:
   a receiving-enable circuit coupled to the comparator,
   wherein the receiving-enable circuit is configured to receive a read control signal from the memory controller and output a receiving-enable signal in response to the read control signal,
   wherein the comparator compares the first voltage value of the first data strobe signal with the reference voltage value of the reference voltage signal in response to the receiving-enable signal.

5. The memory interface according to claim 4, wherein the receiving-enable circuit is further configured to adjust the first voltage value of the first data strobe signal to a predetermined voltage value in response to the read control signal,
   wherein a relative relation between the predetermined voltage value and the reference voltage value of the reference voltage signal does not conform to the default condition.

6. The memory interface according to claim 3, wherein the control circuit further comprises:
   a reset circuit coupled to the state machine circuit and the clock output circuit and configured to count a count value corresponding to the clock signal,
   wherein the reset circuit is further configured to generate a reset signal if the count value conforms to a count condition,
   wherein the state machine circuit is further configured to stop outputting the control signal in response to the reset signal.

7. The memory interface according to claim 2, wherein the clock output circuit comprises:
   a differential amplifier configured to perform a differential amplifying operation on the first data strobe signal and the second data strobe signal in response to the control signal.

8. The memory interface according to claim 7, wherein the clock output circuit further comprises:

a delay line circuit coupled to the differential amplifier and configured to delay an output signal of the differential amplifier and output the clock signal, wherein a difference between the clock signal and the data signal is ¼ clock cycle.

9. The memory interface according to claim 2, wherein the control signal is generated during a period when the first data strobe signal is in a preamble state, wherein during the period when the first data strobe signal is in the preamble state, the relative relation between the first voltage value of the first data strobe signal and the reference voltage value of the reference voltage signal conforms to the default condition.

10. A memory control circuit unit for controlling a volatile memory, comprising:

a processor core;

a memory controller coupled to the processor core; and a memory interface coupled to the memory controller and the volatile memory, wherein the memory interface is configured to receive a first data strobe signal and a second data strobe signal from the volatile memory, wherein the first data strobe signal and the second data strobe signal are differential signals corresponding to each other, wherein the memory interface is further configured to generate a clock signal in response to the first data strobe signal and the second data strobe signal if a relative relation between a first voltage value of the first data strobe signal and a reference voltage value of a reference voltage signal conforms to a default condition, wherein the memory interface is further configured to sample a data signal from the volatile memory based on a raising edge and a falling edge of the clock signal.

11. The memory control circuit unit according to claim 10, wherein the memory interface comprises:

a sampling circuit configured to receive the data signal and the clock signal and configured to sample the data signal based on the raising edge and the falling edge of the clock signal; and a clock generation circuit coupled to the sampling circuit and configured to receive the first data strobe signal and the second data strobe signal, wherein the clock generation circuit generates the clock signal in response to the first data strobe signal and the second data strobe signal if the relative relation between the first voltage value of the first data strobe signal and the reference voltage value of the reference voltage signal conforms to the default condition.

12. The memory control circuit unit according to claim 11, wherein the clock generation circuit comprises:

a control circuit configured to receive the first data strobe signal and the reference voltage signal and generate a control signal if the relative relation between the first voltage value of the first data strobe signal and the reference voltage value of the reference voltage signal conforms to the default condition; and a clock output circuit coupled to the control circuit and configured to receive the first data strobe signal, the second data strobe signal and the control signal, wherein the clock output circuit is further configured to output the clock signal in response to the first data strobe signal, the second data strobe signal and the control signal.

13. The memory control circuit unit according to claim 12, wherein the control circuit comprises:

a comparator configured to compare the first voltage value of the first data strobe signal with the reference voltage value of the reference voltage signal and output a comparison signal; and a state machine circuit coupled to the comparator and configured to output the control signal according to the comparison signal.

14. The memory control circuit unit according to claim 13, wherein the control circuit further comprises:

a receiving-enable circuit coupled to the comparator, wherein the receiving-enable circuit is configured to receive a read control signal from the memory controller and output a receiving-enable signal in response to the read control signal, wherein the comparator compares the first voltage value of the first data strobe signal with the reference voltage value of the reference voltage signal in response to the receiving-enable signal.

15. The memory control circuit unit according to claim 14, wherein the receiving-enable circuit is further configured to adjust the first voltage value of the first data strobe signal to a predetermined voltage value in response to the read control signal, wherein a relative relation between the predetermined voltage value and the reference voltage value of the reference voltage signal does not conform to the default condition.

16. The memory control circuit unit according to claim 13, wherein the control circuit further comprises:

a reset circuit coupled to the state machine circuit and the clock output circuit and configured to count a count value corresponding to the clock signal, wherein the reset circuit is further configured to generate a reset signal if the count value conforms to a count condition, wherein the state machine circuit is further configured to stop outputting the control signal in response to the reset signal.

17. The memory control circuit unit according to claim 12, wherein the clock output circuit comprises:

a differential amplifier configured to perform a differential amplifying operation on the first data strobe signal and the second data strobe signal in response to the control signal.

18. The memory control circuit unit according to claim 17, wherein the clock output circuit further comprises:

a delay line circuit coupled to the differential amplifier and configured to delay an output signal of the differential amplifier and output the clock signal, wherein a difference between the clock signal and the data signal is ¼ clock cycle.

19. The memory control circuit unit according to claim 12, wherein the control signal is generated during a period when the first data strobe signal is in a preamble state, wherein during the period when the first data strobe signal is in the preamble state, the relative relation between the first voltage value of the first data strobe signal and the reference voltage value of the reference voltage signal conforms to the default condition.

20. A memory storage device, comprising:

a connection interface unit configured to couple to a host system;

a rewritable non-volatile memory module;

a volatile memory; and a memory control circuit unit coupled to the connection interface unit, the rewritable non-volatile memory module and the volatile memory, wherein the volatile memory is configured to send a first data strobe signal and a second data strobe signal, wherein the memory control circuit unit is configured to receive the first data strobe signal and the second data strobe signal, wherein the first data strobe signal and the second data strobe signal are differential signals corresponding to each other, wherein the memory control circuit unit is further configured to generate a clock signal in response to the first data strobe signal and the second data strobe signal if a relative relation between a first voltage value of the first data strobe signal and a reference voltage value of a reference voltage signal conforms to a default condition, wherein the memory control circuit unit is further configured to sample a data signal from the volatile memory based on a raising edge and a falling edge of the clock signal.

21. The memory storage device according to claim 20, wherein the memory control circuit unit comprises a memory interface, wherein the memory interface comprises:
a sampling circuit configured to receive the data signal and the clock signal and sample the data signal based on the raising edge and the falling edge of the clock signal; and
a clock generation circuit coupled to the sampling circuit and configured to receive the first data strobe signal and the second data strobe signal,
wherein the clock generation circuit generates the clock signal in response to the first data strobe signal and the second data strobe signal if the relative relation between the first voltage value of the first data strobe signal and the reference voltage value of the reference voltage signal conforms to the default condition.

22. The memory storage device according to claim 21, wherein the clock generation circuit comprises:
a control circuit configured to receive the first data strobe signal and the reference voltage signal and generate a control signal if the relative relation between the first voltage value of the first data strobe signal and the reference voltage value of the reference voltage signal conforms to the default condition; and
a clock output circuit coupled to the control circuit and configured to receive the first data strobe signal, the second data strobe signal and the control signal,
wherein the clock output circuit is further configured to output the clock signal in response to the first data strobe signal, the second data strobe signal and the control signal.

23. The memory storage device according to claim 22, wherein the control circuit comprises:
a comparator configured to compare the first voltage value of the first data strobe signal with the reference voltage value of the reference voltage signal and output a comparison signal; and
a state machine circuit coupled to the comparator and configured to output the control signal according to the comparison signal.

24. The memory storage device according to claim 23, wherein the control circuit further comprises:
a receiving-enable circuit coupled to the comparator, wherein the receiving-enable circuit is configured to receive a read control signal from a memory controller and output a receiving-enable signal in response to the read control signal,
wherein the comparator compares the first voltage value of the first data strobe signal with the reference voltage value of the reference voltage signal in response to the receiving-enable signal.

25. The memory storage device according to claim 24, wherein the receiving-enable circuit is further configured to adjust the first voltage value of the first data strobe signal to a predetermined voltage value in response to the read control signal,
wherein a relative relation between the predetermined voltage value and the reference voltage value of the reference voltage signal does not conform to the default condition.

26. The memory storage device according to claim 23, wherein the control circuit further comprises:
a reset circuit coupled to the state machine circuit and the clock output circuit and configured to count a count value corresponding to the clock signal,
wherein the reset circuit is further configured to generate a reset signal if the count value conforms to a count condition,
wherein the state machine circuit is further configured to stop outputting the control signal in response to the reset signal.

27. The memory storage device according to claim 22, wherein the clock output circuit comprises:
a differential amplifier configured to perform a differential amplifying operation on the first data strobe signal and the second data strobe signal in response to the control signal.

28. The memory storage device according to claim 27, wherein the clock output circuit further comprises:
a delay line circuit coupled to the differential amplifier and configured to delay an output signal of the differential amplifier and output the clock signal,
wherein a difference between the clock signal and the data signal is ¼ clock cycle.

29. The memory storage device according to claim 22, wherein the control signal is generated during a period when the first data strobe signal is in a preamble state,
wherein during the period when the first data strobe signal is in the preamble state, the relative relation between the first voltage value of the first data strobe signal and the reference voltage value of the reference voltage signal conforms to the default condition.

30. A clock generation method for a memory interface for connecting a memory controller to a volatile memory, comprising:
receiving a first data strobe signal and a second data strobe signal from the volatile memory, wherein the first data strobe signal and the second data strobe signal are differential signals corresponding to each other;
generating a clock signal in response to the first data strobe signal and the second data strobe signal if a relative relation between a first voltage value of the first data strobe signal and a reference voltage value of a reference voltage signal conforms to a default condition; and
sampling a data signal from the volatile memory based on a raising edge and a falling edge of the clock signal.

* * * * *